(12) United States Patent
Cheng et al.

(10) Patent No.: US 9,761,694 B2
(45) Date of Patent: Sep. 12, 2017

(54) VERTICAL FET WITH SELECTIVE ATOMIC LAYER DEPOSITION GATE

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/007,520

(22) Filed: Jan. 27, 2016

(65) Prior Publication Data
US 2017/0213899 A1    Jul. 27, 2017

(51) Int. Cl.
| H01L 29/00 | (2006.01) |
|---|---|
| H01L 29/66 | (2006.01) |
| H01L 29/78 | (2006.01) |
| H01L 21/28 | (2006.01) |
| H01L 21/285 | (2006.01) |
| H01L 29/423 | (2006.01) |
| H01L 21/02 | (2006.01) |

(52) U.S. Cl.
CPC .. *H01L 29/66666* (2013.01); *H01L 21/02425* (2013.01); *H01L 21/02532* (2013.01); *H01L 21/28079* (2013.01); *H01L 21/28562* (2013.01); *H01L 29/42372* (2013.01); *H01L 29/66553* (2013.01); *H01L 29/7827* (2013.01)

(58) Field of Classification Search
CPC ......... H01L 29/66666; H01L 21/28562; H01L 29/42372; H01L 21/28079; H01L 21/02532; H01L 29/66553; H01L 21/02425; H01L 29/7827
USPC .......................................................... 257/329
See application file for complete search history.

(56) References Cited

U.S. PATENT DOCUMENTS

| 6,340,629 | B1 * | 1/2002 | Yeo ..................... H01L 29/4941 257/E21.2 |
|---|---|---|---|
| 7,160,819 | B2 | 1/2007 | Conely, Jr. et al. |
| 7,541,269 | B2 | 6/2009 | Kim et al. |
| 7,794,798 | B2 | 9/2010 | Hautala |
| 8,294,180 | B2 | 10/2012 | Doyle et al. |
| 8,637,849 | B2 | 1/2014 | Deligianni et al. |
| 8,815,344 | B2 | 8/2014 | Ma |
| 8,866,214 | B2 | 10/2014 | Guo et al. |
| 8,890,262 | B2 | 11/2014 | Kamineni et al. |

(Continued)

OTHER PUBLICATIONS http://www.cambridgenanotechald.com/atomiclayerdeposition/aldadvantages.shtml—2013.*

(Continued)

*Primary Examiner* — Marc Armand
*Assistant Examiner* — Sue Tang
(74) *Attorney, Agent, or Firm* — Tutunjian & Bitetto, P.C.; Vazken Alexanian

(57) ABSTRACT

Vertical channel field effect transistors and methods of forming the same include forming one or more vertical channels on a bottom source/drain layer. A seed layer is deposited on horizontal surfaces around the one or more vertical channels. A metal gate is deposited on the seed layer. A top source/drain layer is deposited above the one or more vertical channels and the metal gate.

13 Claims, 6 Drawing Sheets

(56) References Cited

U.S. PATENT DOCUMENTS

| | | | |
|---|---|---|---|
| 8,956,959 B2 | 2/2015 | Sekar et al. | |
| 9,112,031 B2 | 8/2015 | Leobandung | |
| 9,362,292 B1* | 6/2016 | Liaw | H01L 27/1104 |
| 2001/0016387 A1* | 8/2001 | Derraa | H01J 9/025 |
| | | | 438/269 |
| 2005/0150758 A1* | 7/2005 | Yakshin | C23C 14/024 |
| | | | 204/192.12 |
| 2005/0285175 A1 | 12/2005 | Cheng et al. | |
| 2013/0095623 A1* | 4/2013 | Guo | H01L 29/4983 |
| | | | 438/268 |
| 2013/0240983 A1 | 9/2013 | Larrieu | |
| 2015/0170961 A1 | 6/2015 | Romero et al. | |
| 2015/0325662 A1 | 11/2015 | Wang et al. | |

OTHER PUBLICATIONS

Kalanyan, Berc. Atomic Layer Deposition and Nucleation of Metals and Metal Oxides: Selective Area Reactions and Conformal 3D Processing, Dissertations : [5772], Dec. 16, 2014.

\* cited by examiner

VERTICAL FET WITH SELECTIVE ATOMIC LAYER DEPOSITION GATE

BACKGROUND

Technical Field

The present invention relates to vertical field effect transistors and, more particularly, to gate formation in a vertical field effect transistor using selective atomic layer deposition.

Description of the Related Art

Forming metal gates in vertical field effect transistors (FETs), where the source and drain regions are vertically aligned and have a vertical channel between them, is challenging. In particular, existing recess processes are subject to a severe loading effect, which causes non-uniform metal deposition heights between regions of the FETs. Loading effect is the dependence of an etch process on the size of the area to etch or recess, with the result being that a larger area has a higher etch rate. This makes it difficult to align the top surface of the gate layer with the tops of the channel structures. In particular, for metal gate vertical FETs, the gate is formed by a deposition-recess process, with the gate length being the thickness of the metal gate after the recess. The loading effect can cause an uneven thickness in the metal gate, leading to a non-uniform gate length. In such a case, the uneven metal gates need to be recessed to make them even with one another before fabrication can continue.

SUMMARY

A method for forming a field effect transistor includes forming one or more vertical channels on a bottom source/drain layer. A seed layer is deposited on horizontal surfaces around the one or more vertical channels. A metal gate is deposited on the seed layer. A top source/drain layer is deposited above the one or more vertical channels and the metal gate.

A method for forming a field effect transistor includes forming one or more vertical channels on a bottom source/drain layer. A bottom spacer is deposited directly on the bottom source/drain layer. A work function metal layer is deposited directly on the bottom spacer. A silicon seed layer is deposited directly on horizontal surfaces of the work function metal layer around the one or more vertical channels. A tungsten gate is deposited directly on the seed layer with atomic layer deposition, nucleated on the seed layer and on no other surface. A top spacer is deposited directly on the tungsten gate. A top source/drain layer is deposited directly on the top spacer and the one or more vertical channels.

A field effect transistor includes a bottom source/drain layer. One or more vertical channels are on the bottom source/drain layer. A horizontal seed layer is formed around the one or more vertical channels. A metal gate is directly on the seed layer. A top source/drain layer is above the one or more vertical channels and the metal gate.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention fabricate vertical field effect transistors (FETs) using a seed layer for metal gate deposition. In particular, the seed layer is formed over a work function metal and is used to form the metal gate from the bottom up, which is insensitive to CD and does not necessitate recessing the gate material. The seed layer is deposited only on horizontal surfaces using an anisotropic deposition process, so that subsequent deposition of the metal gate is limited to vertical growth.

Figure 1:
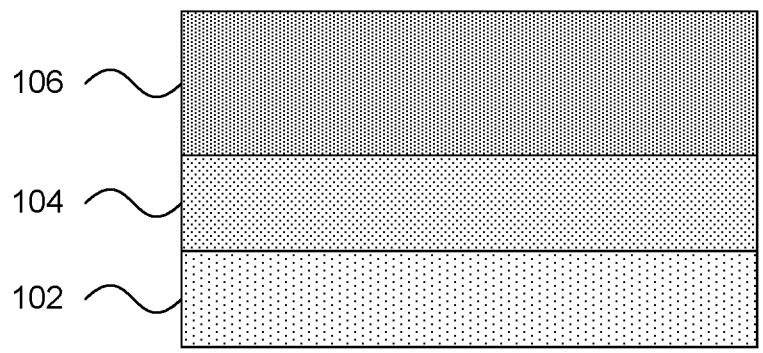
FIG. 1 is a cross-sectional diagram of a step in forming a vertical channel field effect transistor in accordance with the present principles.

Referring now to the drawings in which like numerals represent the same or similar elements and initially to FIG. 1, a step in forming a vertical FET is shown. A substrate 102 is shown and may be formed from any appropriate material including, e.g., bulk semiconductor or a semiconductor-on-insulator layered structure. Illustrative examples of suitable materials for the substrate 102 include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc sellenide.

A bottom source/drain layer 104 is formed on the substrate 102 having an exemplary thickness of about 10 nm to about 100 nm. In one embodiment it is specifically contemplated that the bottom source/drain layer 104 is formed from a doped semiconductor material. It should be understood that the bottom source/drain layer 104 may be either one of a source or a drain layer, as appropriate. Illustrative examples of suitable materials for the bottom source/drain layer 104 include, but are not limited to, silicon, silicon germanium, silicon germanium carbide, silicon carbide, polysilicon, epitaxial silicon, amorphous silicon, and multilayers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc sellenide.

In another embodiment, the source/drain layer 104 may be formed from a III-V semiconductor. The term "III-V compound semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present embodiments include, but are not limited to alloys of gallium arsenic, aluminum arsenic, indium gallium arsenic, indium aluminum arsenic, indium aluminum arsenic antimony, indium aluminum arsenic phosphorus, indium gallium arsenic phosphorus and combinations thereof.

The bottom source/drain layer 104 may be doped with dopant atoms. The dopant atoms may be an n-type dopant (i.e., an element from Group IV or VI of the Periodic Table of Elements) or a p-type dopant (i.e., an element from Group II or VI of the Periodic Table of Elements). Exemplary n-type dopants for a group IV semiconductor include phosphorus, arsenic and antimony. Exemplary p-type dopants for a group IV semiconductor include boron, aluminum, and gallium. Exemplary n-type dopants for a III-V semiconductor include selenium, tellurium, silicon, and germanium. Exemplary p-type dopants for a III-V semiconductor include beryllium, zinc, cadmium, silicon, and germanium. The concentration of dopant within the doped region is typically from about 1011 to about 1015 atoms/cm2, with a concentration of dopant within the doped region from about 1011 to about 1013 atoms/cm2 being more typical. The bottom source/drain layer 104 may be in situ doped as it is deposited on the substrate 102 or, alternatively, may be doped through an implantation process.

A channel layer 106 may be formed on the doped source/drain region. The channel layer 106 may be formed from a same semiconductor material as the bottom source/drain layer 104 as described above, or may be any other appropriate semiconductor material as listed above. In addition, the channel layer 106 may be doped or undoped as described above. If the channel layer 106 is doped, it has a dopant polarity opposite to that of the bottom source/drain layer 104—for example if the bottom source/drain layer 104 has an n-type dopant, the doped channel layer 106 will have a p-type dopant.

Figure 2:
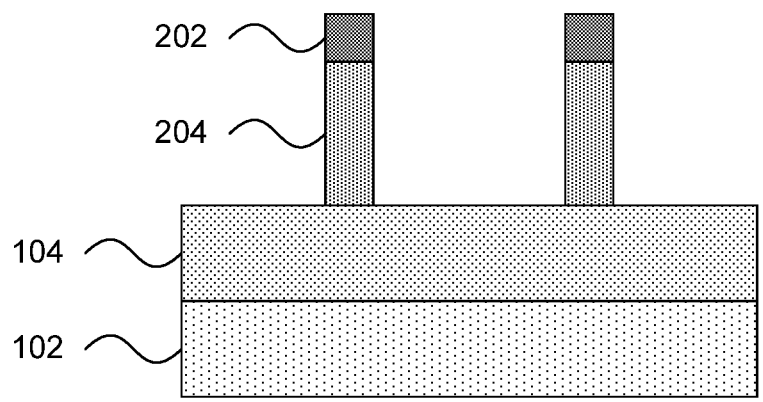
FIG. 2 is a cross-sectional diagram of a step in forming a vertical channel field effect transistor in accordance with the present principles.

Referring now to FIG. 2, a step in forming a vertical FET is shown. Mask(s) 202 are deposited on the channel layer 106 that define regions for the channel(s). The channel layer 106 is etched using an anisotropic etch such as, e.g., reactive ion etching, to remove material that is not covered by the mask(s) 202 to form channels 204. The mask(s) 202 may be formed from soft and/or hardmask materials and may be formed using deposition, photolithography, and etching. In one embodiment, the mask(s) 202 include a silicon nitride layer. In another embodiment, the mask(s) 202 include a photoresist. A photoresist mask can be produced by applying a photoresist layer, exposing the photoresist layer to a pattern of radiation, and then developing the pattern into the photoresist layer utilizing conventional resist developer. In an exemplary embodiment, the channel fins may have an exemplary width of about 5 nm to about 30 nm, an exemplary height of about 10 nm to about 100 nm, and a fin pitch of about 10 nm to about 100 nm.

In one embodiment, a reactive ion etch is used to form the channels 204. Reactive ion etching is a form of plasma etching in which the surface to be etched is placed on a radio frequency powered electrode. During the etch, the surface to be etched takes on a potential that accelerates the etching species extracted from plasma toward the surface, where a chemical etching reaction takes place in the direction normal to the surface. Other examples of anisotropic etching that can be used at this point of the present invention include ion beam etching, plasma etching or laser ablation. Alternatively, the channels 204 can be formed by spacer imaging transfer technique well-known in the art.

Figure 3:
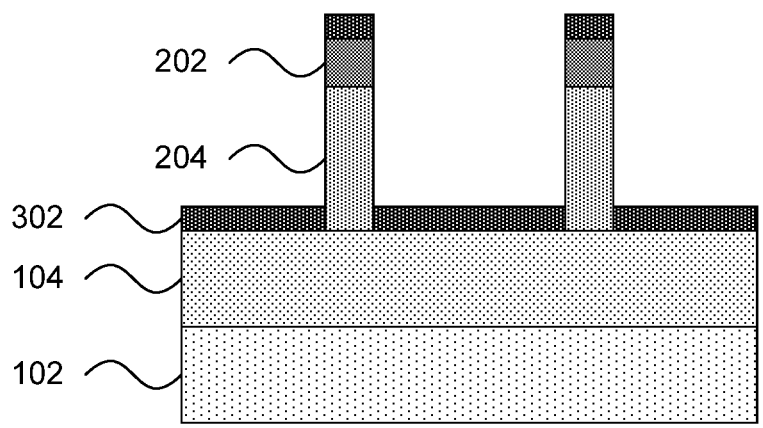
FIG. 3 is a cross-sectional diagram of a step in forming a vertical channel field effect transistor in accordance with the present principles.

Referring now to FIG. 3, a step in forming a vertical FET is shown. A bottom spacer layer 302 is deposited over the mask(s) 202 and the top surface of the bottom source/drain layer 104. It is specifically contemplated that the bottom spacer layer 302 is deposited in an anisotropic manner, without accumulation on the sidewalls of the channels 204. This may be accomplished using, e.g., gas cluster ion beam (GCIB) deposition, where the surface is bombarded by high-energy cluster ions. In alternative embodiments, other forms of deposition may be used to form the bottom spacer layer 302 only on the horizontal surfaces. The bottom spacer layer 302 may be formed from any appropriate dielectric material such as, e.g., silicon dioxide, silicon nitride, silicon borocarbonitride, etc.

Figure 4:
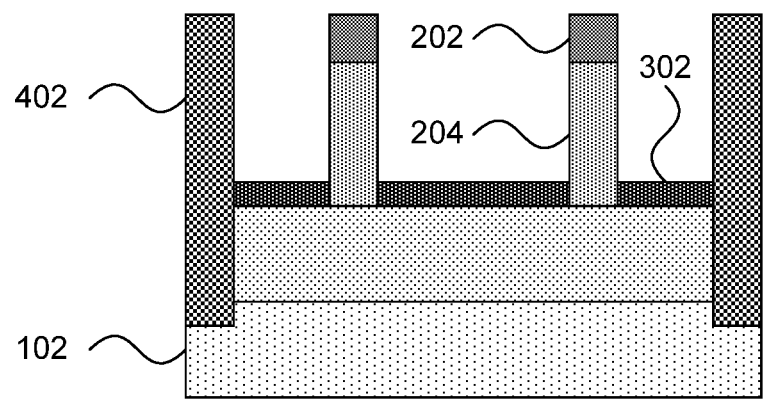
FIG. 4 is a cross-sectional diagram of a step in forming a vertical channel field effect transistor in accordance with the present principles.

Referring now to FIG. 4, a step in forming a vertical FET is shown. Trenches are formed that penetrate the bottom spacer layer 302 and the bottom source/drain region 104, extending partially into the substrate 102. The trenches may be formed by any appropriate process, including an anisotropic etch or machining. Shallow trench isolation (STI) barriers 402 are formed in the trenches. The STI barriers 402 may be formed from any appropriate dielectric including, e.g., silicon dioxide or silicon nitride. In one exemplary embodiment, spacer material over the channels is removed by chemical mechanical planarization/polish (CMP) that stops on the hardmask 202.

Figure 5:
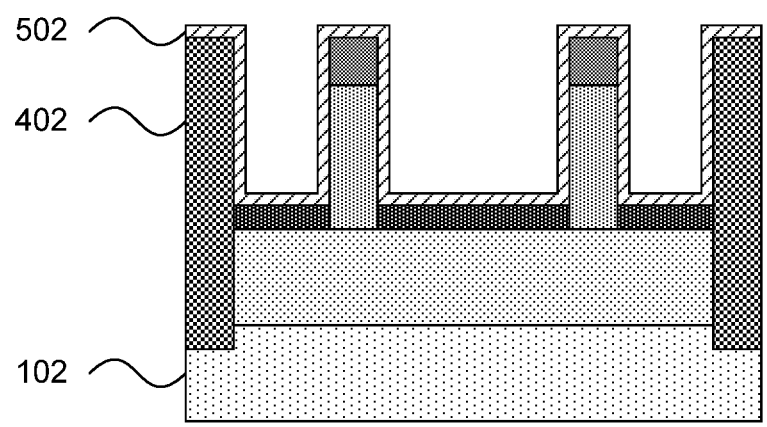
FIG. 5 is a cross-sectional diagram of a step in forming a vertical channel field effect transistor in accordance with the present principles.

Referring now to FIG. 5, a step in forming a vertical FET is shown. A work function metal layer 502 is deposited over the STI barriers 402, the bottom spacer layer 302, and the channels 204. A work function metal layer is a metal layer that effectuates a threshold voltage shift. As used herein, "threshold voltage" is the lowest attainable gate voltage that will turn on a semiconductor device, e.g., transistor, by making the channel of the device conductive. The term "threshold voltage shift," as used herein, refers to a shift in the Fermi energy of a semiconductor device toward a valence band of the semiconductor. A "valence band" is the highest range of electron energies where electrons are normally present at absolute zero. In one exemplary embodiment, the work function metal layer 502 may be formed from, e.g., one of titanium, titanium nitride, and titanium carbide. Other suitable materials include titanium aluminum nitride, rubidium, platinum, molybdenum, cobalt, and alloys and combinations thereof. In one embodiment, the work function metal layer may be deposited by a physical vapor deposition (PVD) method, such as sputtering. In PVD techniques, the work function metal layer may also be formed using chemical vapor deposition (CVD) and atomic layer deposition (ALD).

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface.

Figure 6:
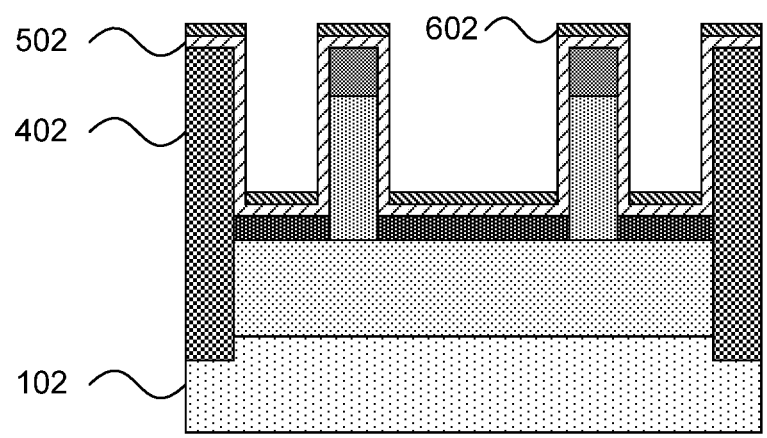
FIG. 6 is a cross-sectional diagram of a step in forming a vertical channel field effect transistor in accordance with the present principles.

Referring now to FIG. 6, a step in forming a vertical FET is shown. A seed layer 602 is formed on the horizontal surfaces. It is specifically contemplated that silicon may be used for the seed layer 602, with an exemplary thickness of about 1 nm to about 2 nm. The seed layer 602 may be deposited using any appropriate anisotropic deposition method, with GCIB being specifically contemplated. It should be noted that anisotropic deposition is particularly useful, as the subsequent metal deposition will occur only on the seeded surfaces, resulting in deposition occurring at a uniform depth at all point.

Figure 7:
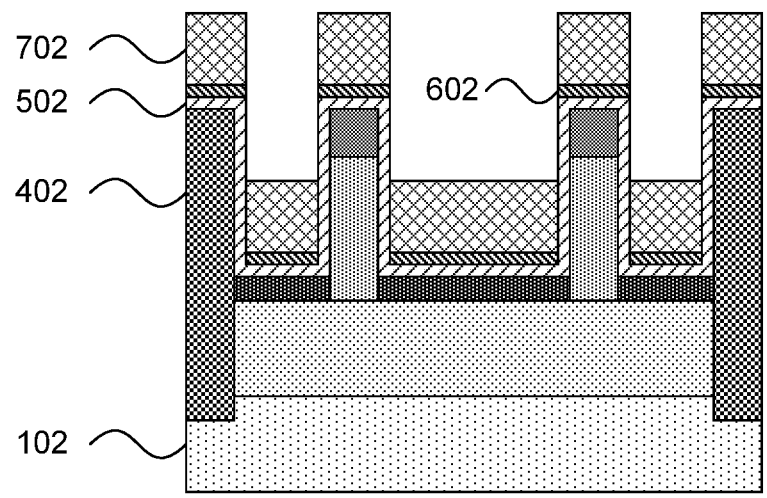
FIG. 7 is a cross-sectional diagram of a step in forming a vertical channel field effect transistor in accordance with the present principles.

Referring now to FIG. 7, a step in forming a vertical FET is shown. Selective metal deposition is performed using selective nucleation on the seed layer 602 to form metal layer 702. In one particular embodiment, it is contemplated that tungsten may be used for the metal layer 702, but it should be understood that any other appropriate gate metal may be used instead. The metal layer 702 may be deposited using, e.g., selective ALD that inhibits the nucleation of the metal on surfaces other than the seed layer 602. This results in the formation of discrete metal regions, each having the same height.

Figure 8:
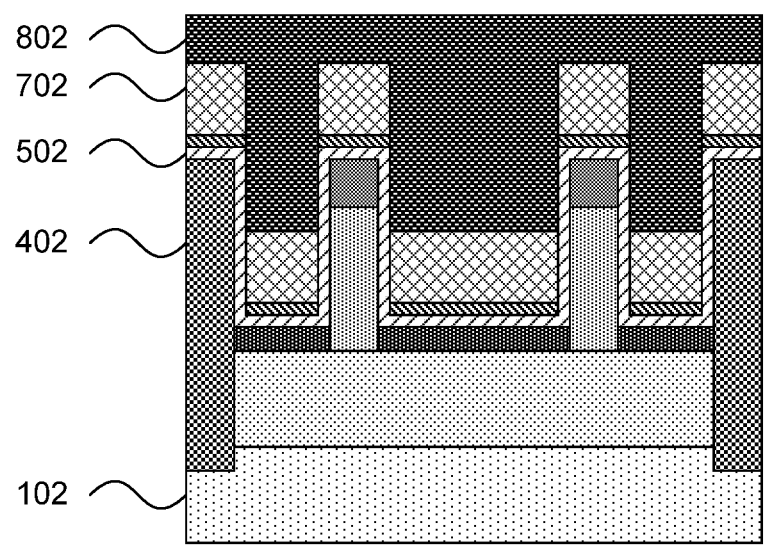
FIG. 8 is a cross-sectional diagram of a step in forming a vertical channel field effect transistor in accordance with the present principles.

Referring now to FIG. 8, a step in forming a vertical FET is shown. A sacrificial dielectric layer 802 is deposited over the metal layer 702. It is specifically contemplated that the sacrificial dielectric layer 802 may be silicon dioxide, but it should be understood that any appropriate dielectric material may be used instead. Exemplary dielectric materials which may be used include, e.g., hafnium oxide, zirconium oxide, lanthanum oxide, aluminum oxide, titanium oxide, strontium titanium oxide, lanthanum aluminum oxide, yttrium oxide, hafnium oxynitride, zirconium oxynitride, lanthanum oxynitride, aluminum oxynitride, strontium titanium oxynitride, lanthanum aluminum oxynitride, yttrium oxynitride, silicates of the above, and alloys of the above. The sacrificial dielectric layer 802 is deposited to such a depth that all surfaces of the metal layer 702 are covered.

Figure 9:
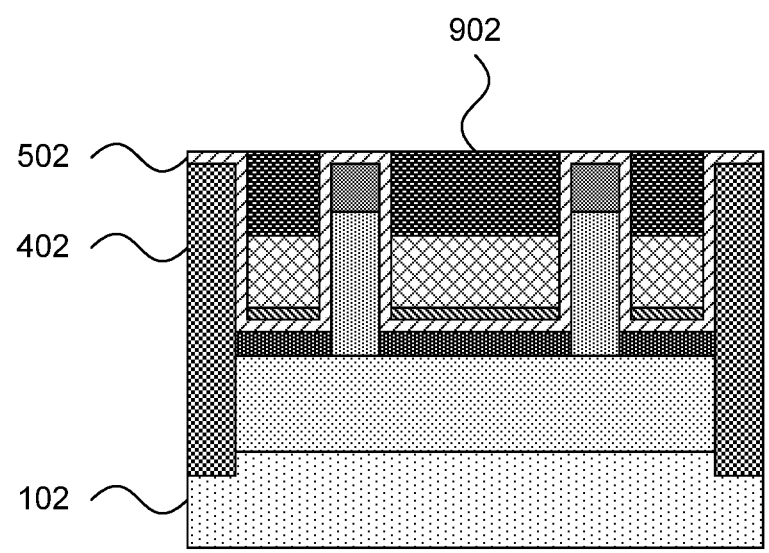
FIG. 9 is a cross-sectional diagram of a step in forming a vertical channel field effect transistor in accordance with the present principles.

Referring now to FIG. 9, a step in forming a vertical FET is shown. The sacrificial dielectric layer 802 is polished down, removing portions of the gate metal layer 702 on top as well as portions of the seed layer 602 on top. This may be accomplished by, e.g., performing a CMP that stops on the work function metal layer 502. A portion 902 of the sacrificial dielectric layer 802 remains over the remaining gate metal layer. CMP is performed using, e.g., a chemical or granular slurry and mechanical force to gradually remove upper layers of the device. The slurry may be formulated to be unable to dissolve, for example, the work function metal layer material, resulting in the CMP process's inability to proceed any farther than that layer.

Figure 10:
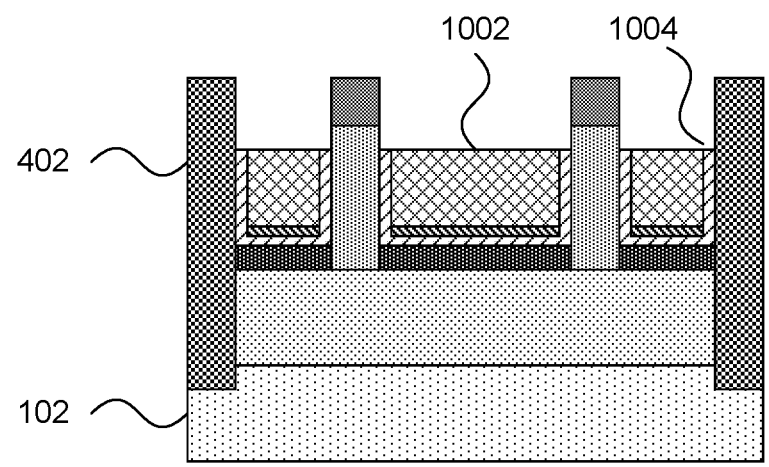
FIG. 10 is a cross-sectional diagram of a step in forming a vertical channel field effect transistor in accordance with the present principles.

Referring now to FIG. 10, a step in forming a vertical FET is shown. The remaining portion 902 of the sacrificial dielectric material is removed using any appropriate etch and the work function metal layer 502 is etched down to the level of the top surface of the gates 1002, with a portion 1004 of the work function metal layer remaining. Any appropriate etching process may be used that is selective to the sacrificial dielectric material and the work function metal material.

Figure 11:
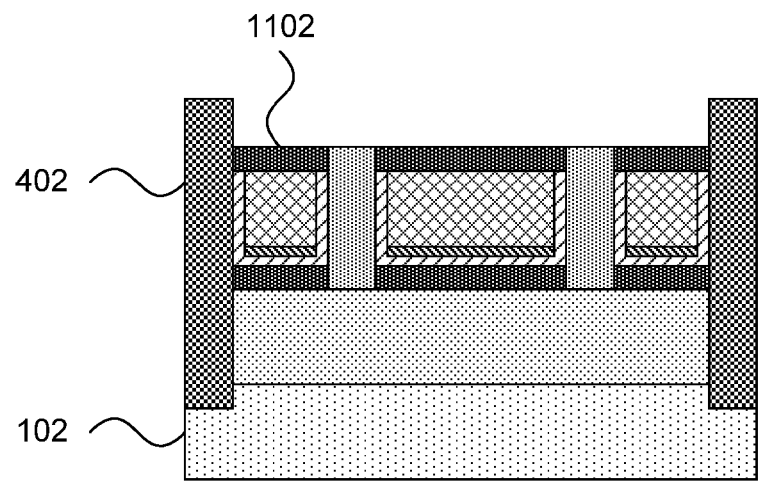
FIG. 11 is a cross-sectional diagram of a step in forming a vertical channel field effect transistor in accordance with the present principles.

Referring now to FIG. 11, a step in forming a vertical FET is shown. The hardmask 202 is removed from the channels 204 using any appropriate process, for example a wet etch that selectively removes the hardmask material. A top spacer layer 1102 is deposited over the gates 1002. The top spacer layer 1102 may be formed from the same material as the bottom spacer layer 302 or from any other appropriate material. It is again specifically contemplated that the top spacer layer 1102 may be deposited using an anisotropic deposition process, such that the spacer material accumulates evenly on the horizontal surfaces.

A wet etch is an isotropic etch that may be chemically tailored to selectively remove a specific material. In general, a wet etch is performed with a combination of an inorganic acid and an oxidizing agent, with formulations for a wet etch including dilute hydrofluoric acid and hot ammonia or hydrochloric acid and peroxide. Other exemplary inorganic acids include, e.g., sulfuric acid, phosphoric acid, or combinations of the above acids. Other exemplary oxidizing agents include, e.g., peroxides, nitrates, nitrites, perchlorates, chlorates, chlorites, hypochlorites, dichromates, permanganates, persulfates or combinations thereof.

Figure 12:
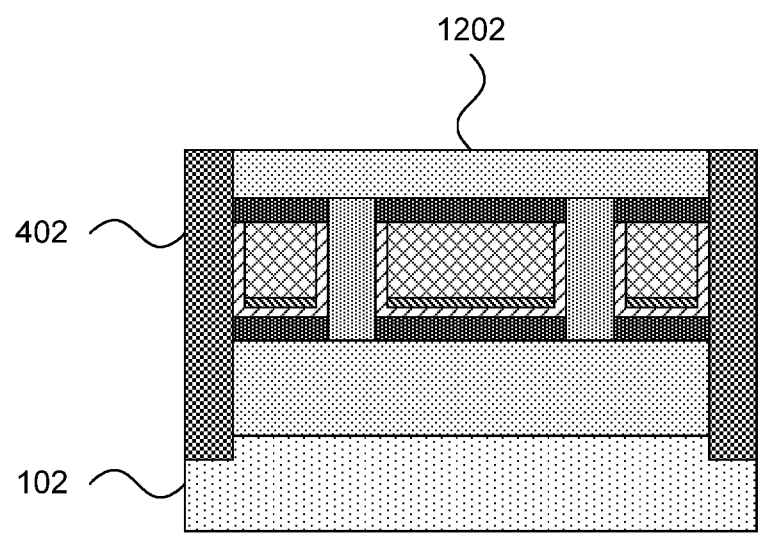
FIG. 12 is a cross-sectional diagram of a step in forming a vertical channel field effect transistor in accordance with the present principles.

Referring now to FIG. 12, a step in forming a vertical FET is shown. A top source/drain layer 1202 is deposited over the top spacer layer 1102 and in contact with the channels 204 using any appropriate deposition process including, e.g., CVD, PVD, or ALD. The top source/drain layer 1202 is formed from a doped semiconductor material, as described above with respect to the bottom source/drain layer 104, and may be either a source or a drain region. In particular, the top source/drain layer 1202 will be whichever of the source and the drain region that the bottom source/drain layer 104 is not. The top source/drain layer 1202 will have a dopant polarity that is the same as that of the bottom source/drain layer 104 and that is opposite to the polarity of the channel 106.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 13:
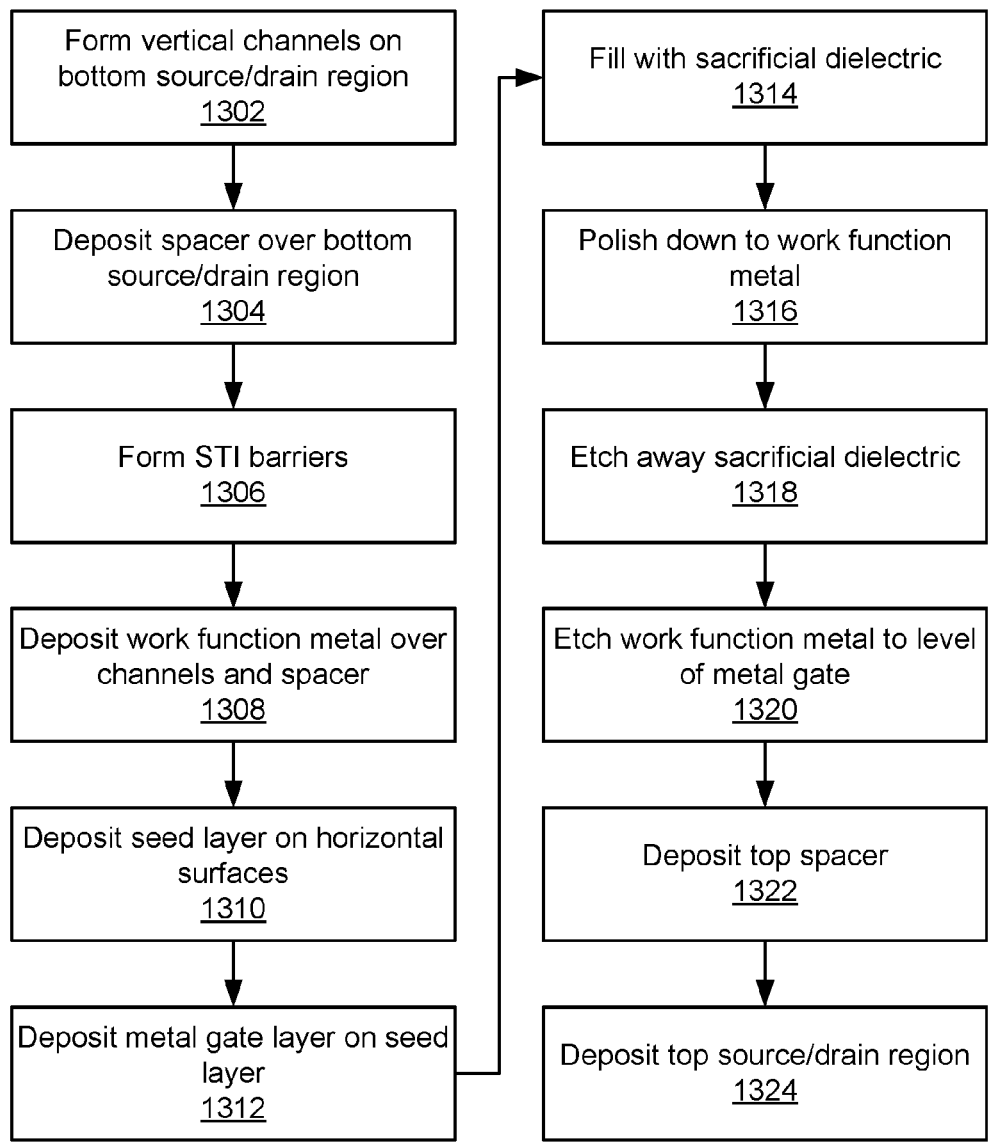
FIG. 13 is a block/flow diagram of a method of forming a vertical channel field effect transistor in accordance with the present principles.

Referring now to FIG. 13, a method of forming a vertical FET is shown. Block 1302 forms vertical channels 204 on a bottom source/drain layer 104. As noted above, this may be accomplished by anisotropically etching a layer of undoped channel material. Block 1304 deposits a bottom spacer layer 302 over the bottom source/drain region 104. This may be a one-step process that preferentially deposits spacer material only directly on the bottom source/drain region 104, or may instead be a two-step process that deposits the spacer material on all horizontal surfaces and subsequently removes the spacer material that is on the channels 204. It is specifically contemplated that GCIB may be used to anisotropically deposit the spacer material.

Block 1306 forms STI barriers to isolate the eventual FET device. Block 1308 isotropically deposits a work function metal layer 502 over the surfaces of the STI barriers, the channels 204, and the bottom spacer 302. This deposition may be performed by any appropriate process including, e.g., PVD, CVD, or ALD.

Block 1310 anisotropically deposits a seed layer 602 on only the horizontal surfaces of the work function metal layer 502. It is specifically contemplated that GCIB may be used to deposit a silicon seed layer 602 to be used for tungsten nucleation. Block 1312 then deposits the metal gate layer 702 on the seed layer 602. The deposition of the metal gate layer 702 may include depositing a layer of tungsten using e.g., a selective ALD process that grows a layer of the metal gate layer 702 only from the seed layer 602, such that all of the portions of the metal gate layer have a same deposition depth.

Block 1314 fills in gapes with a sacrificial dielectric material 802. This material may be deposited by any appropriate process such as, e.g., CVD, PVD, or ALD, and is raised to a height that at least exceeds the level of the work function metal layer 502 and, in one embodiment, exceeds the level of the top gate metal portion. Block 1316 polishes down to the level of the work function metal layer 502, removing a top portion of the sacrificial dielectric material 802 and any metal gate material 702 above the work function metal layer 502. Block 1318 etches away any remaining sacrificial dielectric material 902 to expose the metal gate 1002. Block 1320 etches the work function metal layer 502 down to the level of the metal gate 1002.

Block 1322 deposits a top spacer layer 1102 that rises to the top level of the channels 204. This deposition may be performed by any appropriate process. In one example, a single-step deposition is performed that selectively and anisotropically deposits spacer material only on the metal gates 1002. Alternatively, a two-step deposition is possible, where the spacer material is deposited over all surfaces and subsequently etched to remove material that is not over the metal gates 1002. Block 1324 then deposits a top source/drain layer 1202 on the top spacer layer 1102 and in contact with the channels 204. After fabrication of the vertical FET, electrical contacts can be made to the source, drain, and gate regions as appropriate to connect the FET to other circuitry on- and off-chip.

Having described preferred embodiments of vertical FETs with selective atomic layer deposition gates (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a field effect transistor, comprising:
   forming one or more vertical channels on a bottom source/drain layer;
   depositing a bottom spacer on the bottom source/drain layer;
   depositing a work function metal layer on the bottom spacer;
   depositing a seed layer on horizontal surfaces around the one or more vertical channels after depositing the work function metal;
   depositing a metal gate on the seed layer; and
   depositing a top source/drain layer above the one or more vertical channels and the metal gate.

2. The method of claim 1, wherein depositing the metal gate on the seed layer comprises selectively depositing metal material vertically on the seed layer and on no other surface.

3. The method of claim 2, wherein the seed layer is silicon and wherein depositing the metal gate comprises atomic layer deposition of tungsten, nucleated on the seed layer.

4. The method of claim 1, further comprising removing metal gate material from surfaces above a level of the one or more channels.

5. The method of claim 4, wherein removing metal gate material comprises chemical mechanical planarization.

6. The method of claim 4, further comprising depositing a dielectric filler to a level above the tungsten gate material to be removed prior to removing tungsten gate material.

7. The method of claim 1, further comprising depositing a top spacer on the metal gate before deposition of the top source/drain layer.

8. The method of claim 1, wherein depositing the seed layer comprises gas cluster ion beam deposition.

9. A method for forming a field effect transistor, comprising:
   forming one or more vertical channels on a bottom source/drain layer;
   depositing a bottom spacer directly on the bottom source/drain layer;
   depositing a work function metal layer directly on the bottom spacer;
   depositing a silicon seed layer directly on horizontal surfaces of the work function metal around the one or more vertical channels;
   depositing a tungsten gate directly on the seed layer with atomic layer deposition, nucleated on the seed layer and on no other surface;
   depositing a top spacer directly on the tungsten gate; and
   depositing a top source/drain layer directly on the top spacer and the one or more vertical channels.

10. The method of claim 9, further comprising removing tungsten gate material from surfaces above a level of the one or more channels.

11. The method of claim 10, wherein removing tungsten gate material comprises chemical mechanical planarization.

12. The method of claim 10, further comprising depositing a dielectric filler to a level above the tungsten gate material to be removed prior to removing tungsten gate material.

13. The method of claim 9, wherein depositing the seed layer comprises gas cluster ion beam deposition.

* * * * *